(12) United States Patent
Cho et al.

(10) Patent No.: US 9,264,005 B1
(45) Date of Patent: Feb. 16, 2016

(54) TECHNIQUES FOR EFFICIENT RADIO FREQUENCY POWER AMPLIFIER

(71) Applicant: Marvell International Ltd., Hamilton (BM)

(72) Inventors: SeongHwan Cho, Sungnam (KR); Renaldi Winoto, Danville, CA (US); Li Lin, Saratoga, CA (US)

(73) Assignee: MARVELL INTERNATIONAL LTD., Hamilton (BM)

( * ) Notice: Subject to any disclaimer, the term of this patent is extended or adjusted under 35 U.S.C. 154(b) by 83 days.

(21) Appl. No.: 13/928,269

(22) Filed: Jun. 26, 2013

Related U.S. Application Data

(60) Provisional application No. 61/668,830, filed on Jul. 6, 2012.

(51) Int. Cl.
*H03G 3/10* (2006.01)
*H03G 3/00* (2006.01)

(52) U.S. Cl.
CPC .................................. *H03G 3/004* (2013.01)

(58) Field of Classification Search
CPC ........................................................ H03G 3/10
USPC .......................... 330/280, 279, 129, 136, 297
See application file for complete search history.

(56) References Cited

U.S. PATENT DOCUMENTS

| | | | | |
|---|---|---|---|---|
| 3,900,823 A | * | 8/1975 | Sokal et al. | 330/149 |
| 6,614,310 B2 | * | 9/2003 | Quarfoot et al. | 330/297 |
| 7,088,968 B2 | * | 8/2006 | Zipper | 455/126 |
| 7,135,930 B2 | * | 11/2006 | Verbist et al. | 330/297 |
| 7,504,881 B2 | * | 3/2009 | Grundlingh | 330/136 |
| 8,050,638 B2 | * | 11/2011 | Vinayak et al. | 455/126 |
| 8,921,755 B2 | * | 12/2014 | Ricard et al. | 250/214 A |
| 2001/0022532 A1 | * | 9/2001 | Dolman | 330/149 |
| 2008/0280573 A1 | * | 11/2008 | Lane et al. | 455/126 |
| 2011/0140777 A1 | * | 6/2011 | Drogi et al. | 330/127 |

* cited by examiner

*Primary Examiner* — Henry Choe

(57) ABSTRACT

A method adjusts an amplitude of a power amplifier output voltage based on an amplitude feedback signal and adjusts a phase of the power amplifier output voltage based on a phase feedback signal. The method also controls a power efficiency of the power amplifier output voltage.

15 Claims, 9 Drawing Sheets

TECHNIQUES FOR EFFICIENT RADIO FREQUENCY POWER AMPLIFIER

CROSS REFERENCE TO RELATED APPLICATIONS

This application claims the benefit of and priority to U.S. Provisional Application 61/668,830, filed 6 Jul. 2012, which is incorporated by reference herein in its entirety.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

In wireless communication technology, transceivers are used in various applications such as, for example, cellular telephones, cordless telephones, pagers, global positioning systems, and other applications. A transceiver chip typically includes a transmitter and receiver for performing the wireless communication functions.

A transmitter includes a radio frequency (RF) power amplifier (PA) that amplifies the load voltage signal to a required specification and also includes an output stage and an antenna that are both used to transmit the load voltage signal. An RF power amplifier requires sufficient power efficiency so that the PA achieves low-power consumption.

An RF power amplifier should also meet the linearity specification in the output signal in order to achieve a reliable communication. The non-linear components can introduce undesired frequency tones which degrade the wireless transmission process because these undesired frequency tones can lead to, for example, noise or other interference that degrades the transmitted signal in the receiver side.

Increasing the linearity in the transmitter typically involves high-power consumption. Accordingly, increasing the linearity in the transmitter leads to a decreased power efficiency of the transmitter.

On the other hand, decreasing the linearity in the transmitter leads to an increased power efficiency of the transmitter. In other words, such a trade-off exists between the goals of achieving an increased power efficiency and an increased linearity.

FIGURES

Non-exhaustive embodiments of the present disclosure are described with reference to the following figures.

SUMMARY

In one embodiment of the disclosure, a method includes: adjusting an amplitude of a power amplifier output voltage based on an amplitude feedback signal; adjusting a phase of the power amplifier output voltage based on a phase feedback signal; and controlling a power efficiency of the power amplifier output voltage.

In another embodiment of the present disclosure, an apparatus includes: a circuit configured to adjust an amplitude of a power amplifier output voltage based on an amplitude feedback signal; a circuit configured to adjust a phase of the power amplifier output voltage based on a phase feedback signal; and a circuit configured to control a power efficiency of the power amplifier output voltage.

DETAILED DESCRIPTION

Reference will now be made in detail to embodiment(s) of the disclosure, an example(s) of which is (are) illustrated in the accompanying drawings. Wherever possible, the same reference numbers will be used throughout the drawings to refer to the same or like parts.

In the following detailed description, for purposes of explanation, numerous specific details are set forth to provide a thorough understanding of the various embodiments of the disclosure. Those of ordinary skill in the art will realize that these various embodiments of the disclosure are illustrative only and are not intended to be limiting in any way. Other embodiments of the disclosure will readily suggest themselves to such skilled persons having the benefit of this disclosure.

Figure 1:
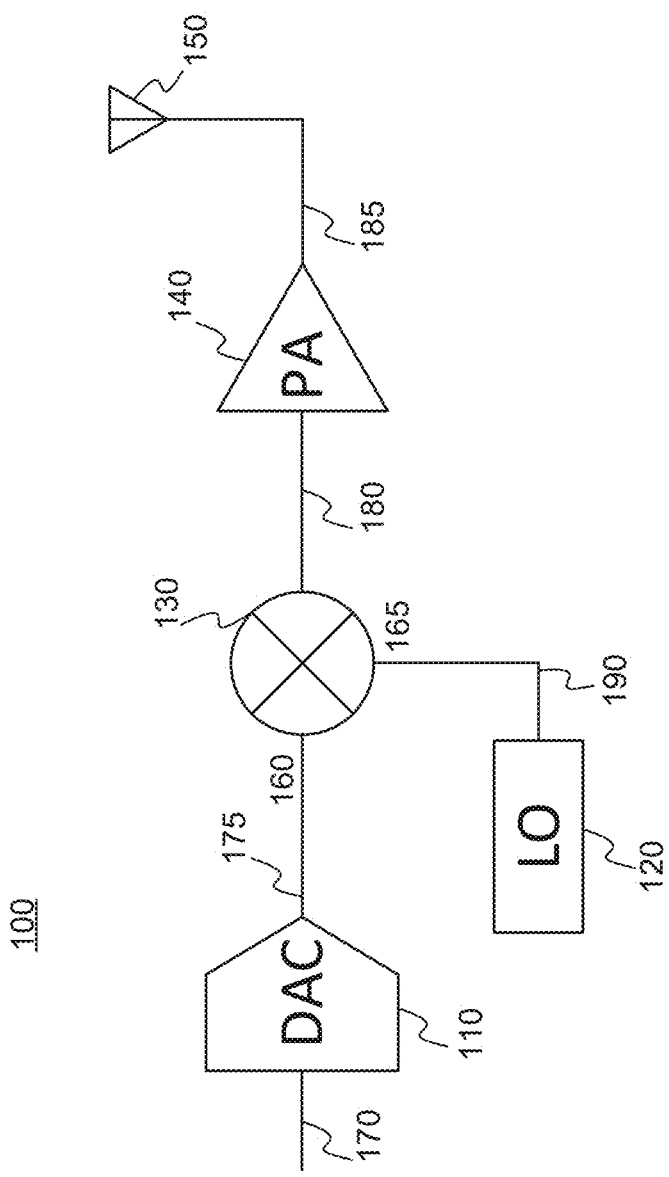
FIG. 1 is a simplified block diagram of a transmitter, in accordance with an embodiment of the present disclosure.

FIG. 1 is a simplified block diagram of a transmitter 100, in accordance with an embodiment of the present disclosure. The transmitter 100 includes a base-band (BB) digital-analog converter (DAC) 110, a local oscillator (LO) 120, a mixer 130, and a power amplifier (PA) 140, and an antenna 150.

The DAC 110 performs the conversion of an analog BB signal 170 to a digital BB signal 175. The mixer 130 converts the digital BB signal 175 to a radio-frequency (RF) signal 180 by modulation of the signal 175 with a local oscillator (LO) signal 190. The mixer 130 has a BB port 160 that receives the analog BB signal 175 and an LO port 165 that receives the LO signal 190. The PA 140 amplifies the RF signal 180 to transmit the amplified RF signal 185 to the antenna 150.

Figure 2:
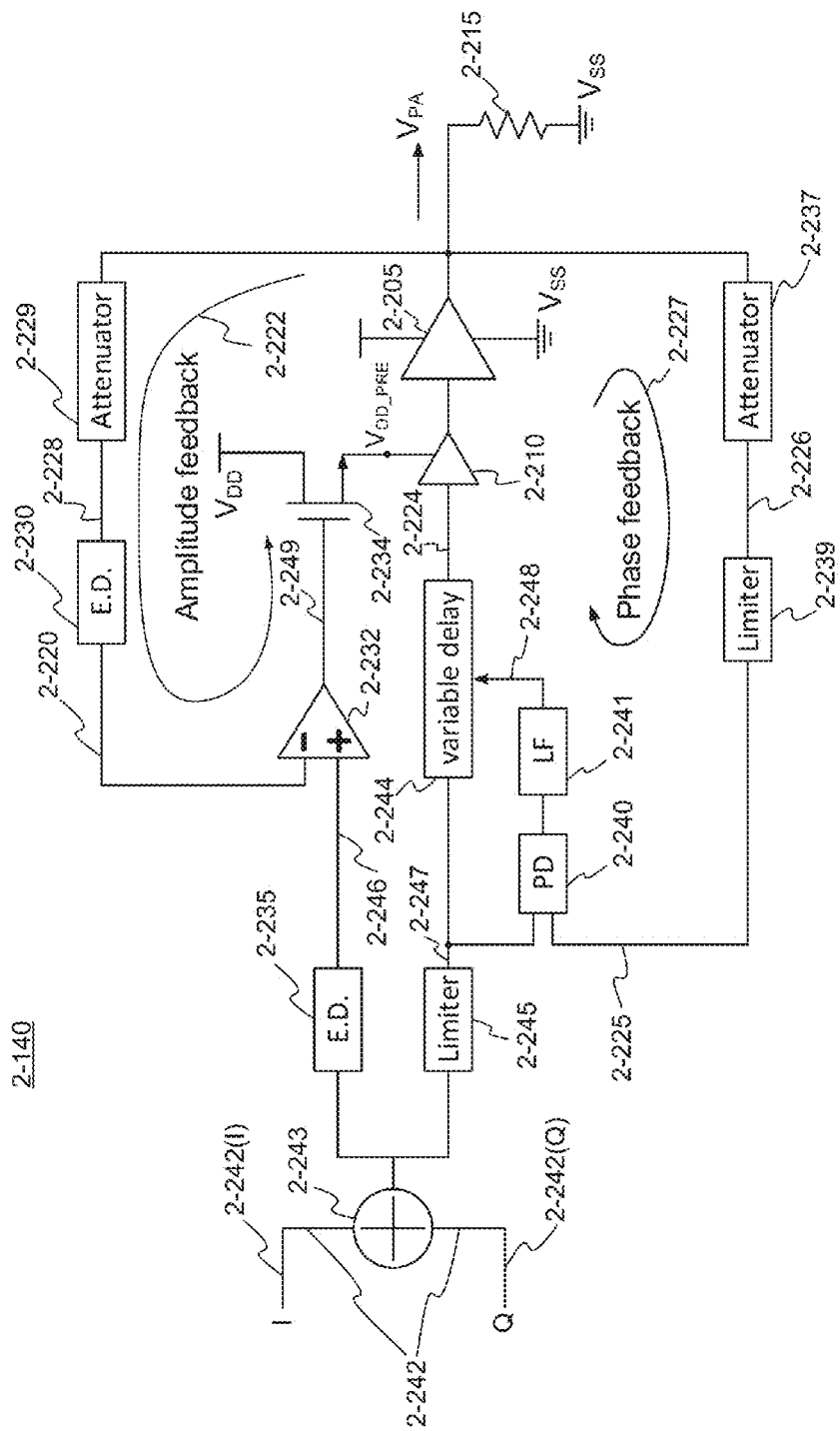
FIG. 2 is a block diagram of a power amplifier, in accordance with an embodiment of the present disclosure.

FIG. 2 is a block diagram of a power amplifier (PA) 2-140, in accordance with an embodiment of the present disclosure. The PA 2-140 includes a switching power amplifier (PA) 2-205 with an input connected to a driver 2-210 and an output connected to an output load 2-215.

In one embodiment as shown in FIG. 2, the switching PA 2-205 is configured to modulate a switching frequency of the switching PA 2-205. The switching frequency allows the PA 2-205 to set the correct amplitude for the output voltage $V_{PA}$ from the switching PA 2-205. The output voltage $V_{PA}$ will also be a voltage across the load 2-215 which can be a resistive load between the output of the switching PA 2-205 and the ground potential $V_{SS}$ (or ground voltage $V_{SS}$). In one embodiment, the switching PA 2-205 is biased between a positive voltage level VDD and the ground voltage $V_{SS}$.

In an embodiment, the switching PA 2-205 includes an amplitude feedback loop 2-222 and a phase feedback loop 2-227, as will be discussed further below.

Typically, the amplitude feedback loop 2-222 includes an amplitude feedback loop attenuator 2-229 connected to the output of the PA 2-205, an amplitude feedback loop envelope detector (E.D.) 2-230 connected to the attenuator 2-229, a comparator 2-232 with a negative (−) input connected to the envelope detector 2-230, and a transistor 2-234 with a gate connected to the output of the comparator 2-232. The positive (+) input of the comparator 2-232 is connected to a signal path envelope detector 2-235.

The transistor 2-234 is connected between the positive voltage value $V_{DD}$ and the driver 2-210. As an example, the transistor 2-234 is an NMOS transistor. As will be discussed below with reference to FIG. 6, the transistor 2-234 provides a pre-driver voltage supply control that efficiently controls the amplitude of the output voltage $V_{PA}$ of the switching power amplifier (PA) 2-205.

Typically, the phase feedback loop 2-227 includes a phase feedback loop attenuator 2-237 connected to the output of the PA 2-205, a phase feedback loop limiter 2-239 connected to the attenuator 2-237, a phase detector 2-240 connected to the limiter 2-239, a low pass filter 2-241 connected to the phase detector 2-240, and a variable delay block 2-244 connected between the low pass filter 2-241 and the input of the driver 2-210.

The In-phase data (I-data) and Quadrature data (Q-data) quadrature modulation techniques are used to enable two independent signals to be combined at a transmitter, transmitted on the same transmission band, and separated at a receiver. The principle of quadrature modulation is that two separate signals, I-data and Q-data, are modulated by using the same carrier wave frequency, but the carrier wave of the Q-data is ninety degrees out of phase with the carrier wave of the I-data. The I-data and Q-data are modulated at the mixer 130 (in FIG. 1) and are summed by the adder 2-243 before transmission to the power amplifier 2-140.

The signal path envelope detector 2-235 outputs the envelope signal 2-246 of the modulated signal 2-242 (which is formed by the signals 2-242(I) and 2-242(Q)). The comparator 2-232 compares the amplitude of the envelope signal 2-246 with the amplitude feedback envelope signal 2-220. For example, if the amplitude feedback envelope signal 2-220 has an amplitude that is less than the amplitude of the envelope signal 2-246 caused by nonlinearity of the driver 2-210 and the switching PA 2-205, then the comparator 2-232 generates a high amplitude correction signal 2-249 that is transmitted into the gate of the transistor 2-234. In response to the high amplitude correction signal 2-249 at the gate of the transistor 2-234, the transistor 2-234 will increase current from the $V_{DD}$ voltage node to transmit to the driver 2-210. As a result, the driver 2-210 increases its voltage input into the switching PA 2-205, and the switching PA 2-205 will increase the voltage amplitude of the PA output voltage $V_{PA}$. In this manner, the gain of the driver 2-210 is increased when the voltage amplitude of the PA output voltage $V_{PA}$ is lower than the amplitude component of a desired output signal.

The amplitude feedback attenuator 2-229 outputs an amplitude feedback attenuated signal 2-228 by decreasing the voltage amplitude of the PA output voltage $V_{PA}$. The amplitude feedback envelope detector 2-230 generates an amplitude feedback envelope signal 2-220 by detecting envelopes of the amplitude feedback attenuated signal 2-228. The magnitude of the amplitude feedback envelope signal 2-220 has been increased due to the increased voltage amplitude of the PA output voltage $V_{PA}$. Accordingly, a difference between the magnitude of the amplitude feedback envelope signal 2-220 and that of the envelope signal 2-246 decreases. In this manner, the amplitude feedback loop 2-222 performs a feedback operation to compensate the difference in magnitude between the amplitude feedback envelope signal 2-220 and the envelope signal 2-246. Since the voltage amplitude of the PA output voltage $V_{PA}$ can be adjusted to a desired level using the amplitude feedback loop 2-222, the feedback loop 2-222 improves the linearity of the power amplifier 2-140.

In the phase back loop 2-227, the phase feedback attenuator 2-237 outputs a phase feedback attenuated signal 2-226 by decreasing the voltage amplitude of the PA output voltage $V_{PA}$. The limiter 2-239 outputs a phase feedback signal 2-225 obtained from limiting or clamping the phase feedback attenuated signal 2-226 to predetermined upper and lower limiting levels. Using the phase feedback signal 2-225 as an input signal, the phase detector 2-240 compares the phase of a phase signal 2-247 with the phase of the phase feedback signal 2-225. The phase detector 2-240 generates a phase difference value 2-248 between the phase of the phase signal 2-247 and the phase of the phase feedback signal 2-225. The low pass filter 2-241 will filter any noise in the phase difference value 2-248. The variable delay block 2-244 adds or subtracts a delay in the phase signal 2-247 of the modulated signal 2-242, depending on the phase difference value 2-248. The delayed phase signal 2-224 is converted to the voltage amplitude of the PA output voltage $V_{PA}$ by the driver 2-210 and the switching PA 2-205. The phase of the PA output voltage $V_{PA}$ can be adjusted to a desired phase using the phase feedback loop 2-227, the feedback loop 2-227 improves the linearity of the power amplifier 2-140.

Figure 3:
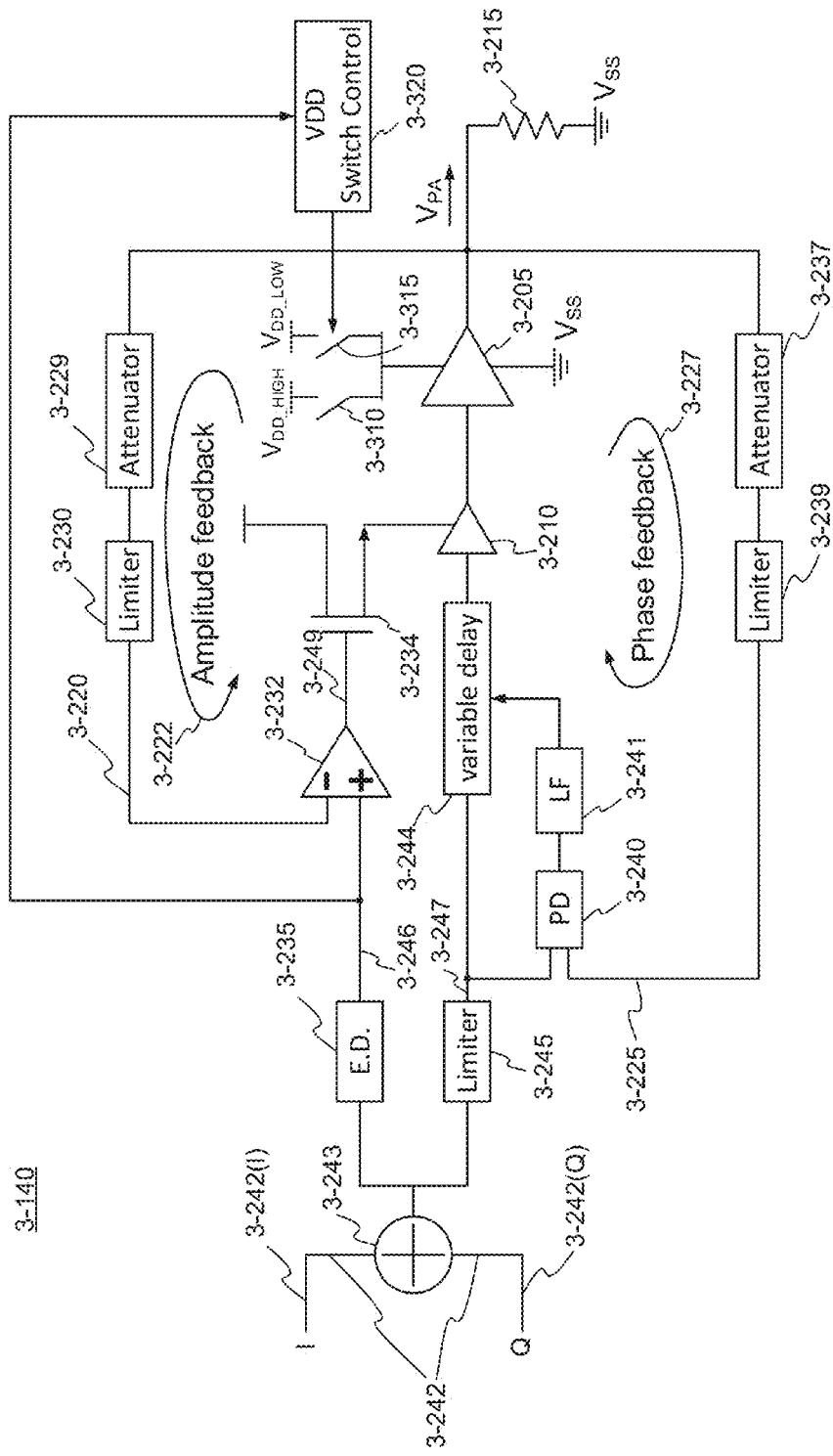
FIG. 3 is a block diagram of a power amplifier, in accordance with another embodiment of the present disclosure.

FIG. 3 is a block diagram of a power amplifier 3-140, in accordance with an embodiment of the present disclosure. The power amplifier 3-140 includes a switching power amplifier (PA) 3-205 with an input connected to a driver 3-210 and an output connected to an output load 3-215.

In an embodiment, the power amplifier 3-140 includes an amplitude feedback loop 3-222, which operates similarly to the amplitude feedback loop 2-222 (FIG. 2) as discussed above. The power amplifier 3-140 also includes a phase feedback loop 3-227, which operates similarly to the phase feedback loop 2-227 (FIG. 2) as discussed above. Therefore, the two feedback loops 3-222 and 3-227 improve the linearity in the switching power amplifier 3-205, as similarly discussed above.

The power amplifier 3-140 includes similar components as described above for the power amplifier 2-140. However, the power efficiency of the switching power amplifier 3-205 is improved by biasing the switching PA 3-205 between a dual power supply $V_{DD\_HIGH}$ to $V_{DD\_LOW}$ and the ground voltage $V_{SS}$ and allowing the bias of the PA 3-205 to switch from $V_{DD\_LOW}$ to $V_{DD\_HIGH}$ and vice versa. The magnitude of the higher voltage supply $V_{DD\_HIGH}$ is greater than that of the lower voltage supply $V_{DD\_LOW}$.

In an embodiment shown in FIG. 3, the power amplifier 3-140 includes a $V_{DD}$ switch control 3-320 that controls the switches 3-310 and 3-315. The switch 3-310 connects the higher voltage supply $V_{DD\_HIGH}$ to the switching PA 3-205, while the switch 3-315 connects the lower voltage source $V_{DD\_LOW}$ to the switching PA 3-205.

In one embodiment, the $V_{DD}$ switch control 3-320 detects the amplitude of an envelope signal 3-246 of the modulated signal 3-242. For example, the $V_{DD}$ switch control 3-320 detects the amplitude (e.g., a local minimum amplitude) of the envelope signal 3-246 at pre-determined prior time (e.g., about 1.0 microsecond) before the switching PA 3-205 outputs the PA output voltage $V_{PA}$ (with that amplitude value).

When the $V_{DD}$ switch control 3-320 detects, for example, the amplitude of the envelope signal 3-246 as less than a threshold voltage (e.g., the lower voltage $V_{DD\_LOW}$), then the $V_{DD}$ switch control 3-320 will turn on the switch 3-315 so that the lower voltage supply $V_{DD\_LOW}$ biases the switching PA 3-205. The $V_{DD}$ switch control 3-320 will also turn off the switch 3-310 so that the higher voltage supply $V_{DD\_HIGH}$ is disconnected from the switching PA 3-205. When the lower voltage supply $V_{DD\_LOW}$ biases the switching PA 3-205, the voltage headroom of $V_{DD\_LOW}$ (i.e., a voltage difference between the $V_{DD\_LOW}$ level and the ground voltage level $V_{SS}$) is less than the voltage headroom of $V_{DD\_HIGH}$. Therefore, the $V_{DD}$ switch control 3-320 saves power (increase power efficiency) when the switch control 3-320 controls the switches 3-310 and 3-315 to supply the lower voltage $V_{DD\_LOW}$ to the switching PA 3-205.

When the $V_{DD}$ switch control 3-320 detects, for example, a subsequent amplitude of the envelope signal 3-246 as greater than the threshold voltage (e.g., the lower supply voltage $V_{DD\_LOW}$), then the $V_{DD}$ switch control 3-320 will turn on the switch 3-310 so that the higher voltage supply $V_{DD\_HIGH}$ biases the switching PA 3-205 and will also turn off the switch 3-315 so that the lower voltage supply $V_{DD\_LOW}$ is disconnected from the switching PA 3-205. When the higher voltage supply $V_{DD\_HIGH}$ biases the switching PA 3-205, the voltage headroom of $V_{DD\_HIGH}$ (i.e., a voltage difference between the $V_{DD\_HIGH}$ level and the ground voltage level $V_{SS}$) is greater than the voltage headroom of $V_{DD\_LOW}$. Due to the greater voltage headroom of $V_{DD\_HIGH}$, the $V_{DD}$ switch control 3-320 prevents clipping of the amplitude of the envelope signal 3-246. Since the voltage clipping causing nonlinearity of the switching PA 3-205 is prevented, using the dual switching voltages $V_{DD\_HIGH}$ to $V_{DD\_LOW}$ improves the linearity of the power amplifier 3-140.

As a further example, when the $V_{DD}$ switch control 3-320 detects another subsequent amplitude of the envelope signal 3-246 as less than the threshold voltage (e.g., the lower voltage $V_{DD\_LOW}$), then the $V_{DD}$ switch control 3-320 will turn on the switch 3-315 so that the lower voltage supply $V_{DD\_LOW}$ biases the switching PA 3-205 and will also turn off the switch 3-310 so that the higher voltage supply $V_{DD\_HIGH}$ is disconnected from the switching PA 3-205. Therefore, the $V_{DD}$ switch control 3-320 saves power (increases power efficiency) when the switch control 3-320 controls the switches 3-310 and 3-315 to supply the lower voltage $V_{DD\_LOW}$ to the switching PA 3-205.

Figure 4:
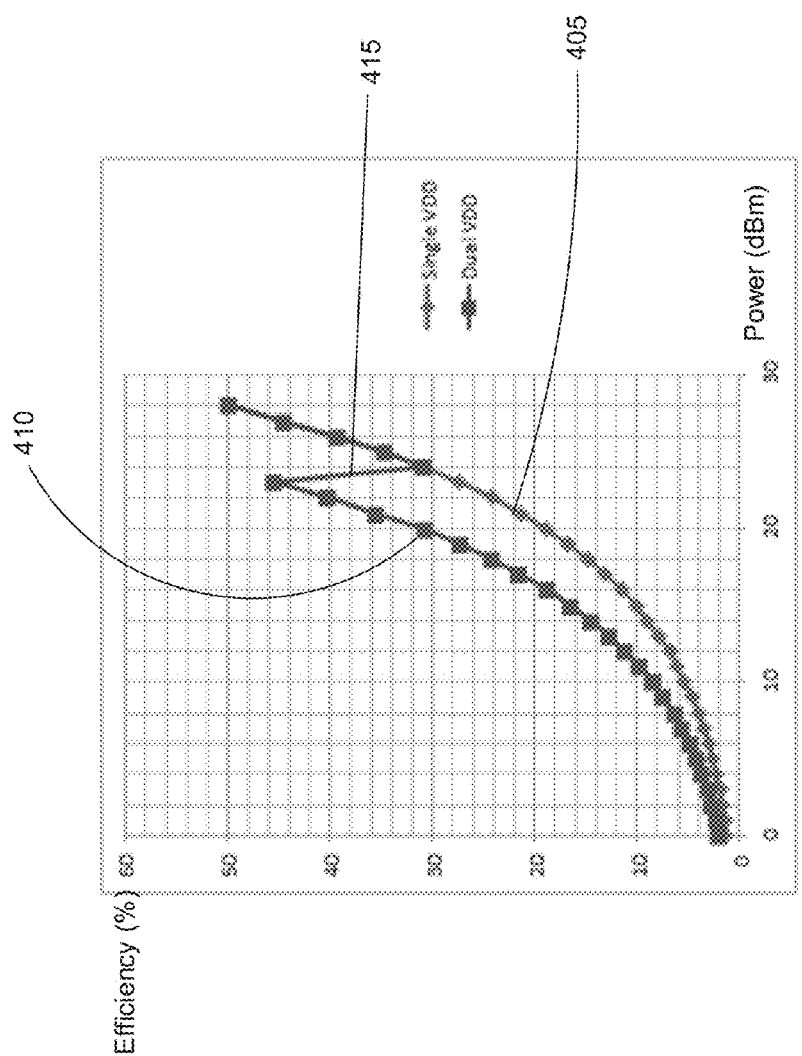
FIG. 4 is a graph that shows examples of increased power efficiency results of a power amplifier, in accordance with an embodiment of the disclosure.

FIG. 4 is a graph that shows examples of increased power efficiency results of the power amplifier 3-140 (FIG. 3), in accordance with an embodiment of the disclosure. The Y-axis indicates efficiency percentage values (i.e., ratio of output power of the power amplifier 3-140 and input power of the power amplifier 3-140) and the X-axis indicates the power output Pout(dBm) of the power amplifier 3-140.

The curve 405 indicates the efficiency percentage values if the power amplifier 3-205 uses a single voltage value $V_{DD}$ (e.g., the higher voltage value $V_{DD\_HIGH}$). The curve 410 indicates the efficiency percentage values if the power amplifier 3-205 uses dual switching voltage values $V_{DD\_HIGH}$ and $V_{DD\_LOW}$ as similarly discussed in FIG. 3. The power efficiency of a power amplifier 3-205 is higher when the lower voltage supply $V_{DD\_LOW}$ biases the power amplifier 3-205 at the lower power regions (e.g., Pout<24 dBm). As one example at Pout=19 dBm, the power efficiency is about 28.3% for the power amplifier 3-205 that is biased by the lower voltage $V_{DD\_LOW}$, as compared to a power efficiency of about 19% for the power amplifier 3-205 that is biased by the higher voltage $V_{DD\_HIGH}$. For higher Pout values (e.g., Pout=about 24 dBM or higher), the $V_{DD}$ switch control 3-320 controls the switches 3-310 and 3-315 to allow the power amplifier 3-205 to switch from the lower voltage supply $V_{DD\_LOW}$ to the higher voltage supply $V_{DD\_HIGH}$, as shown by the transition line 415 from $V_{DD\_LOW}$ to $V_{DD\_HIGH}$, so that a sufficient voltage headroom is provided for higher voltage amplitudes of the envelope signal 3-246 to prevent clipping of the output voltage $V_{PA}$ of the power amplifier 3-205.

Figure 5:
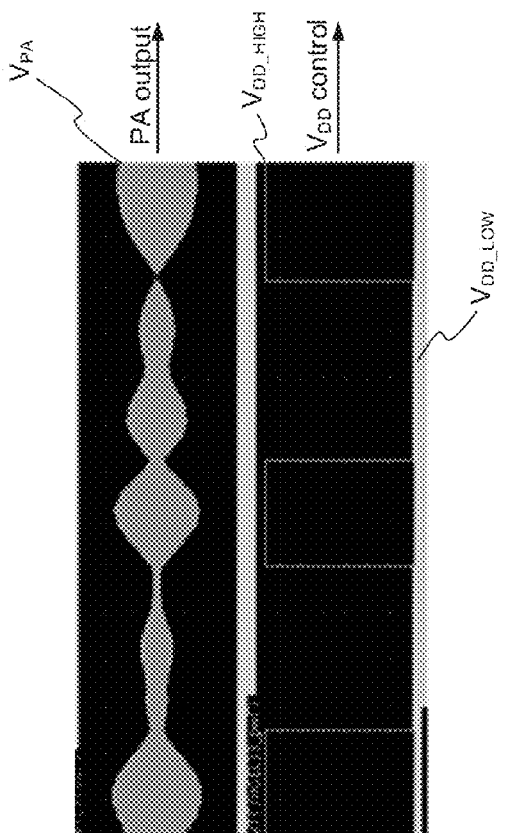
FIG. 5 illustrates waveforms that show the glitch prevention feature of a VDD switch control, in accordance with an embodiment of the disclosure.
Figure 5:
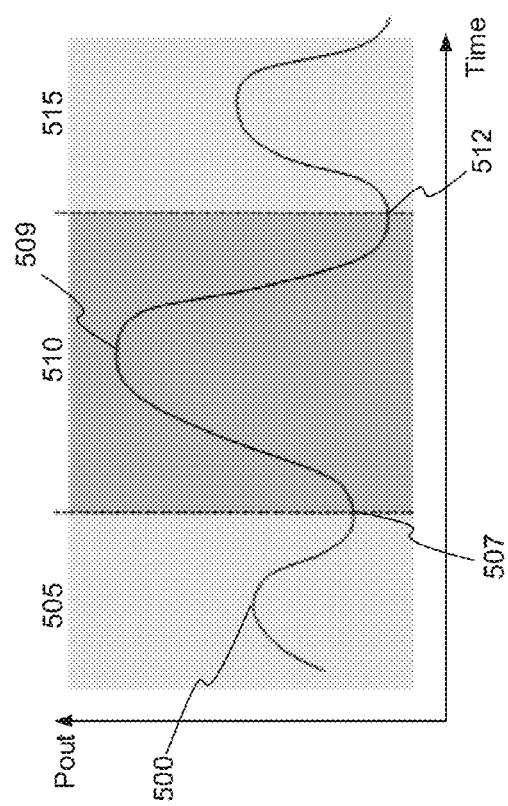

Reference is now made to FIG. 3 and FIG. 5 for discussion of the switching of the $V_{DD\_HIGH}$ and $V_{DD\_LOW}$ voltages while reducing or eliminating glitches during switching, in accordance with an embodiment of the disclosure. FIG. 5 illustrates waveforms of a switching power amplifier output power Pout in order to show the glitch prevention feature of the $V_{DD}$ switch control 3-320 (FIG. 3), in accordance with an embodiment of the disclosure. The output power Pout of the power amplifier 3-205 is shown versus time according to the waveform 500. When the $V_{DD}$ switch control 3-320 detects the minimum amplitude value of the waveform 500 at a waveform portion 507, the $V_{DD}$ switch control 3-320 switches the bias of the power amplifier 3-205 from $V_{DD\_LOW}$ to $V_{DD\_HIGH}$ as similarly discussed above. At waveform portion 509, the waveform 500 is at a maximum amplitude and is within the voltage headroom formed by the higher voltage $V_{DD\_HIGH}$.

The $V_{DD}$ switch control 3-320 will wait for the next minimum amplitude value of the waveform 500 before switching the bias of the power amplifier 3-205. When the $V_{DD}$ switch control 3-320 detects the minimum amplitude value of the waveform 500 at the waveform portion 512, the $V_{DD}$ switch control 3-320 switches the bias of the power amplifier 3-205 from $V_{DD\_HIGH}$ to $V_{DD\_LOW}$.

Since the $V_{DD}$ switch control 3-320 performs switching between the bias voltages $V_{DD\_HIGH}$ and $V_{DD\_LOW}$ at the minimum amplitude portions 507 and 512 of the waveform 500, any glitch due to the switching of the bias voltages will be at a minimum. Since the $V_{DD}$ switch control 3-320 can minimize a glitch occurrence, the communication performance of the transmitter 100 (FIG. 1) is improved. The glitch-free output voltage waveform $V_{PA}$ of the power amplifier 3-140 is also seen in FIG. 5 with reference to the switching of the bias from $V_{DD\_LOW}$ to $V_{DD\_HIGH}$, and vice versa.

In order for the $V_{DD}$ switch control 3-320 to detect a minimum amplitude at, for example, the waveform portions 507 and 512, the $V_{DD}$ switch control 3-320 compares the amplitude value along the path 3-340 (FIG. 3) with a reference minimum voltage amplitude value. This minimum voltage amplitude value can, for example, be programmed in the $V_{DD}$ switch control 3-320 as a threshold value for comparison with the amplitude value that the $V_{DD}$ switch control 3-320 detects at the path 3-340. The $V_{DD}$ switch control 3-320 can include a comparator to compare the reference minimum voltage amplitude value with the amplitude of the waveform 500 and to drive the switches 3-310 and/or 3-315.

Figure 6:
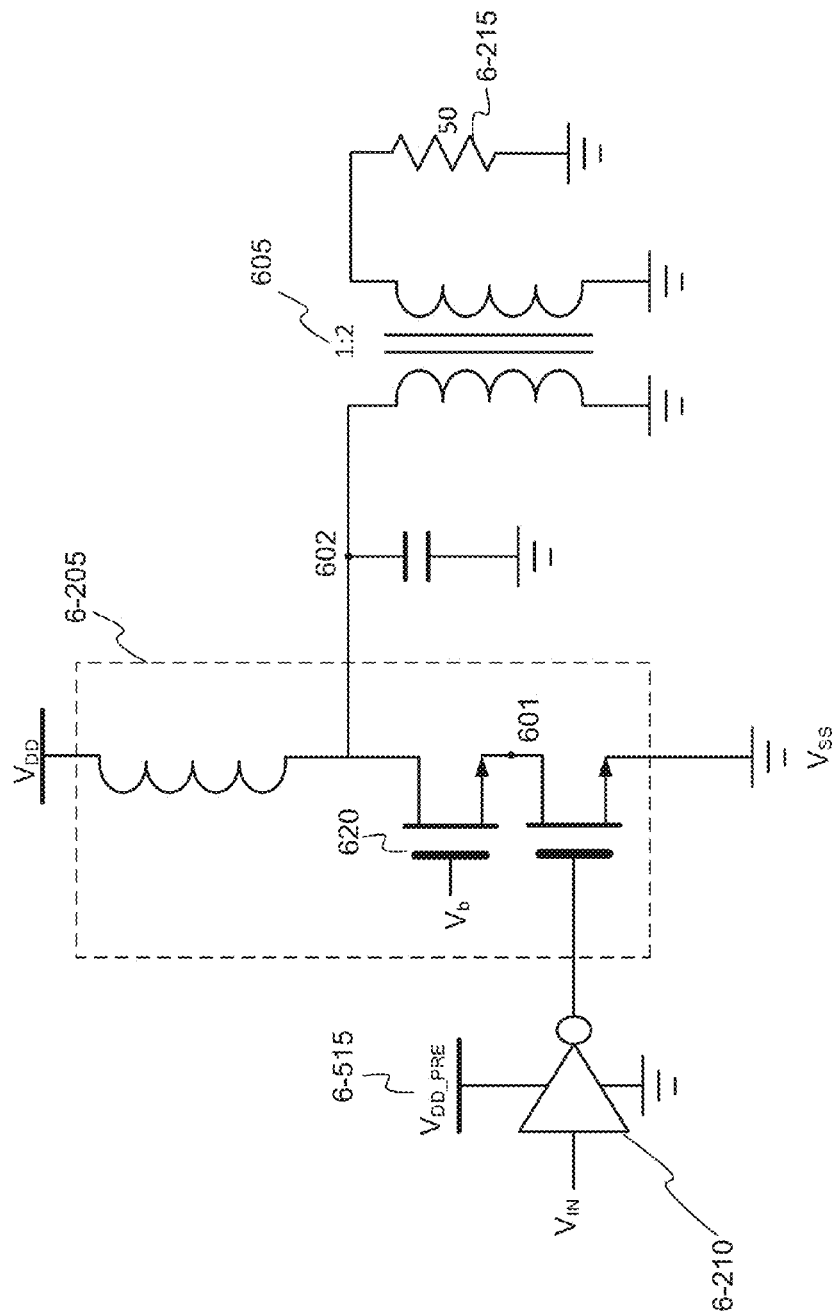
FIG. 6 is a diagram of a power amplifier with a pre-driver voltage supply control, in accordance with an embodiment of the disclosure.

FIG. 6 is a diagram of a power amplifier 6-205 with a pre-driver voltage supply control unit 6-515, in accordance with an embodiment of the disclosure. This control unit 6-515 controls the bias of the driver 6-210 and permits a relatively efficient amplitude control of the output voltage $V_{PA}$ of the power amplifier 6-205, as will be discussed below.

As discussed above with reference to FIG. 2, if the amplitude feedback envelope signal 2-220 has an amplitude that is less than the amplitude of the envelope signal 2-246 caused by nonlinearity of the driver 2-210 and the switching PA 2-205, then the comparator 2-232 generates a high amplitude correction signal 2-249 that is transmitted into the gate of the transistor 2-234. In response to the high amplitude correction signal at the gate of the transistor 2-234, the transistor 2-234 will increase current from the $V_{DD}$ voltage node to transmit to the driver 2-210 and pull up the driver supply voltage $V_{DD\_PRE}$. The increased driver supply voltage $V_{DD\_PRE}$ increases a gain of the driver 6-210, and thus increases a total gain of the power amplifier 2-140 (FIG. 2) obtained from the driver 6-210 and the power amplifier 6-205. Therefore, an output voltage signal of the power amplifier 6-205 at node 602 is amplified with a greater gain using the control unit 6-515.

Figure 7:
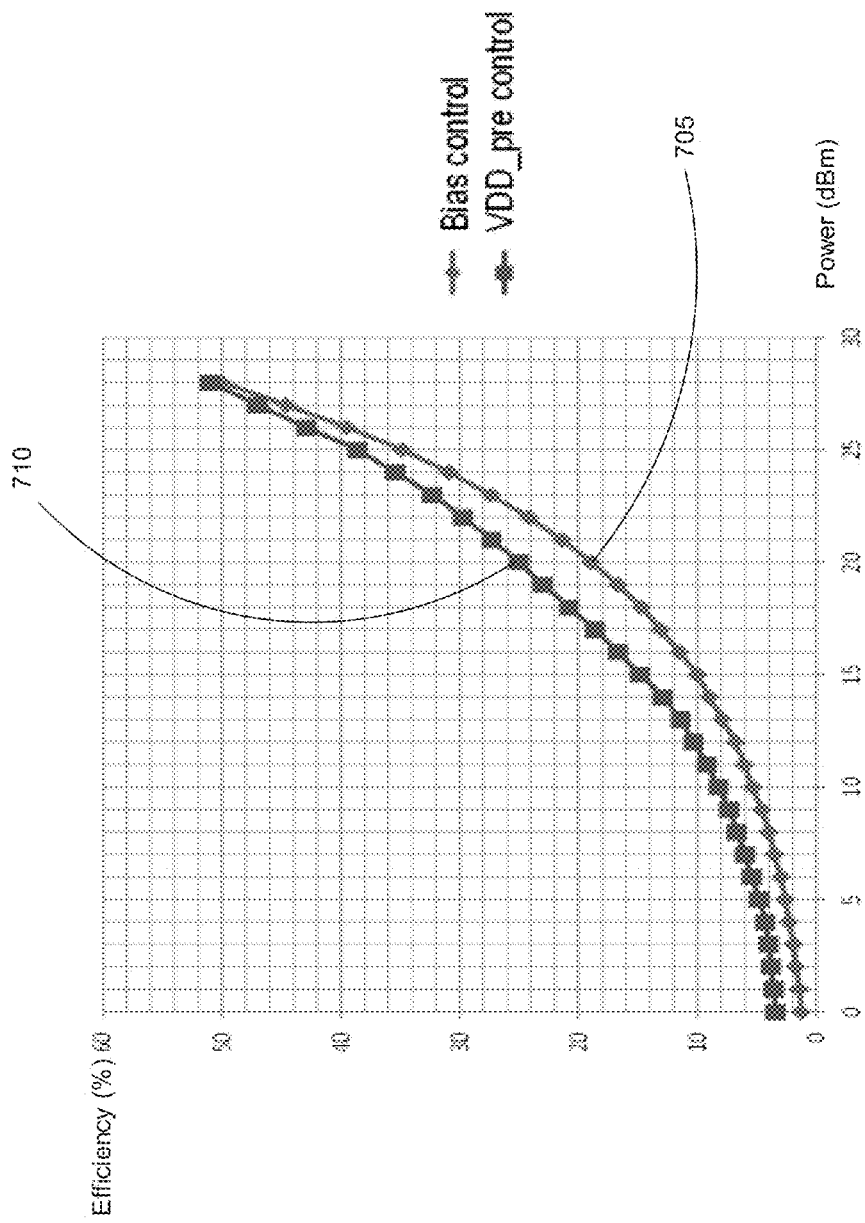
FIG. 7 is a graph that shows examples of increased power efficiency results of a power amplifier, in accordance with an embodiment of the disclosure.

FIG. 7 is a graph that shows examples of increased power efficiency results of the power amplifier 3-140 of FIG. 3, in accordance with an embodiment of the disclosure. The Y-axis indicates efficiency percentage values (ratio of output power of the power amplifier 3-140 and input power of the power amplifier 3-140) and the X-axis indicates the power output (dBm) of the power amplifier 3-140.

The curve 705 indicates the efficiency percentage values if a bias control Vb (FIG. 6) at the gate of a transistor 620 is used to control the amplitude of the power amplifier output. The curve 710 indicates the efficiency percentage values if the pre-driver supply control unit (VDD_pre control) 6-515 is used to control the amplitude of the power amplifier output.

As seen in the example output power Pout of the power amplifier 6-205, the power efficiency of a power amplifier 3-140 (FIG. 3) is higher when the pre-driver supply control is used for amplitude control of the voltage output $V_{PA}$ of the power amplifier 6-205. As one example at Pout=19 dBm, the power efficiency is about 24.5% for the power amplifier 3-140 with a pre-driver supply control, as compared to a power efficiency of about 19% for the power amplifier 3-140 with a bias voltage Vb that is varied for amplitude control of the power amplifier output voltage.

Figure 8:
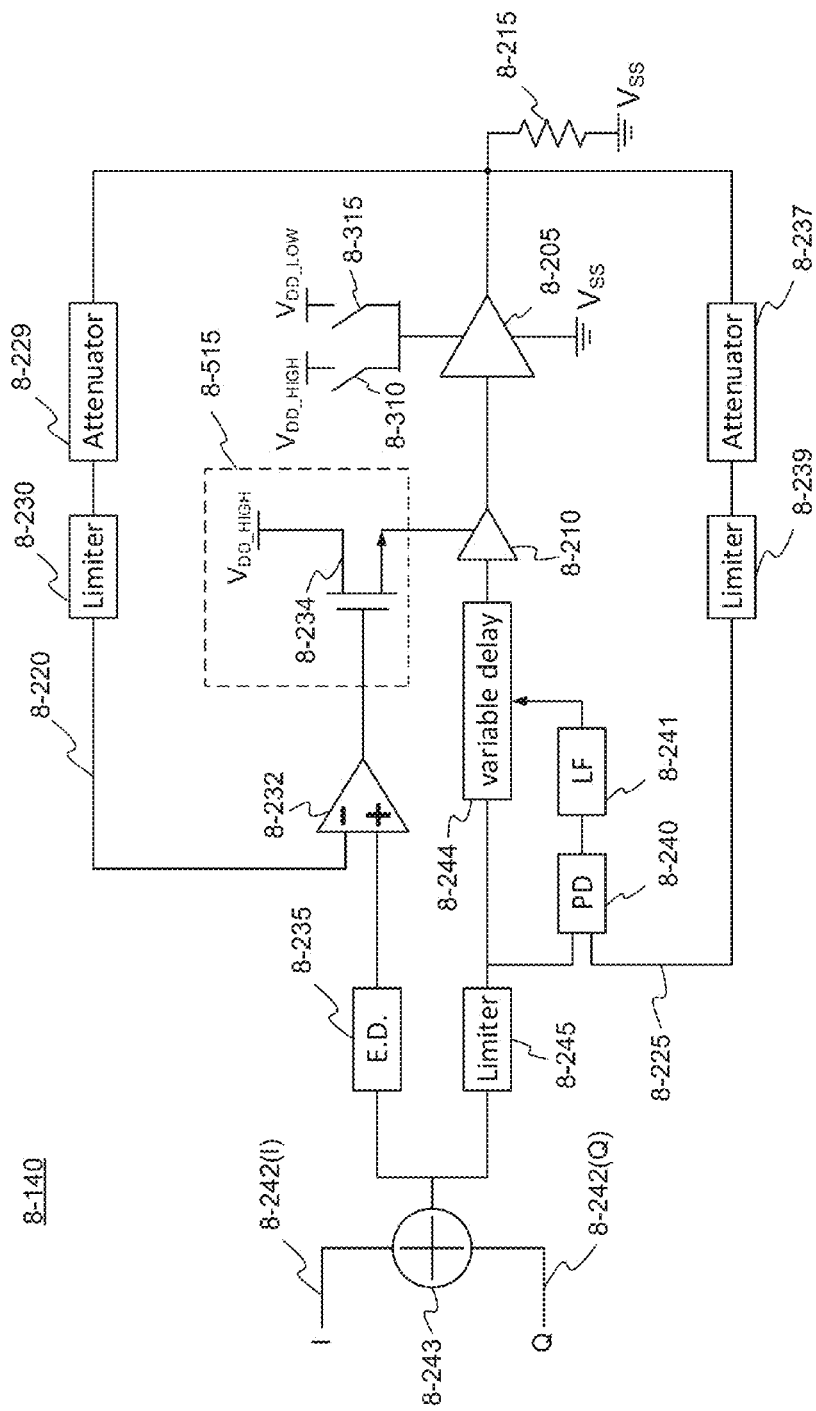
FIG. 8 is a diagram of a power amplifier with a pre-driver voltage supply control, in accordance with an embodiment of the disclosure.

FIG. 8 is a diagram of a power amplifier 8-140 with a pre-driver voltage supply control unit 8-515, in accordance with an embodiment of the disclosure. As shown, the pre-driver voltage supply control unit 8-515 can be a transistor 8-234 connected between the higher voltage supply $V_{DD\_HIGH}$ and the driver 8-210. The comparator 8-232 has an output connected to the pre-driver voltage supply control unit 8-515 for controlling the driver supply voltage $V_{DD\_pre}$ to the driver 8-210 and for controlling the amplitude of the output voltage $V_{PA}$ of the switching power amplifier 8-205, as discussed above with reference to FIGS. 2 and 6.

Also shown as connected to the power amplifier 8-205 is the dual voltage supply $V_{DD\_HIGH}$ and $V_{DD\_LOW}$ that is connected to the power amplifier 8-205 by use of the switches 8-310 and 8-315, respectively. Accordingly, an embodiment of the power amplifier 8-140 can include both the pre-driver supply control unit 8-515 for efficient amplitude control of the power amplifier output voltage $V_{PA}$ and the dual power supply $V_{DD\_HIGH}$ and $V_{DD\_LOW}$.

Figure 9:
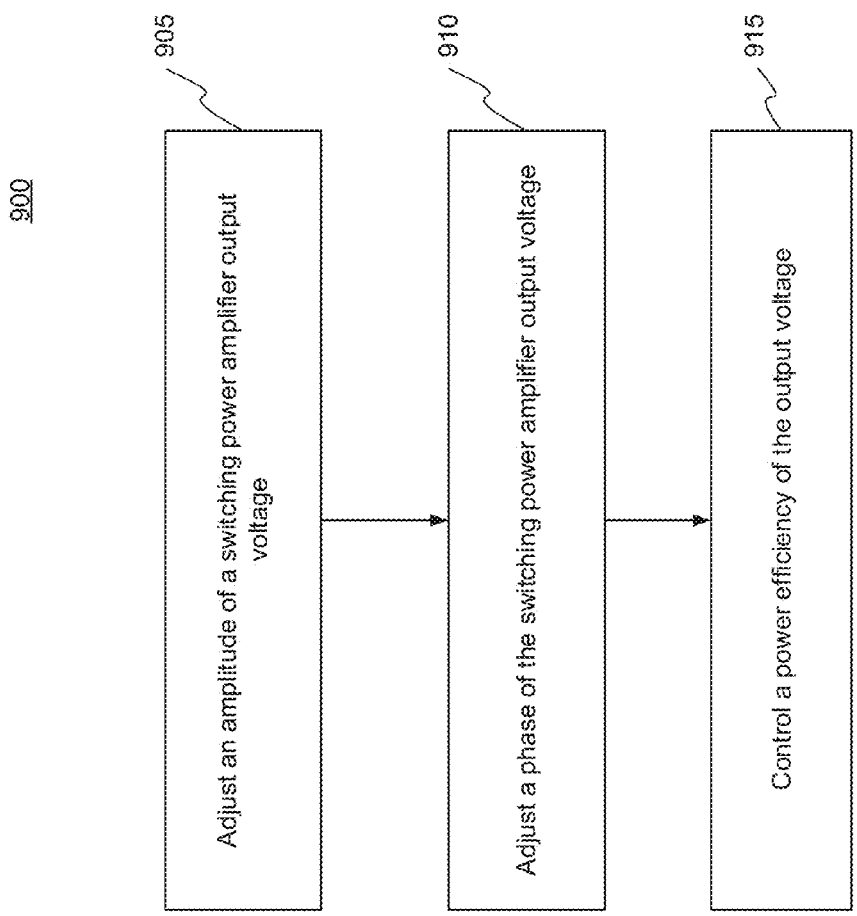
FIG. 9 is a flow diagram of a method, in accordance with an embodiment of the disclosure.

FIG. 9 is a flow diagram of a method 800, in accordance with an embodiment of the disclosure.

At 905, an amplitude of a power amplifier (e.g., switching power amplifier) output voltage is adjusted based on an amplitude feedback signal. An envelope of a modulated signal is compared with an amplitude feedback signal to output an amplitude correction signal. The amplitude correction signal is applied to a gate of a driver to control a gain and a driver supply voltage $V_{DD\_PRE}$ of the driver. The gain and the driver voltage supply voltage $V_{DD\_PRE}$ should be raised if the amplitude of the switching power amplifier output voltage is lower than the amplitude component of a desired radio frequency (RF) output signal, and vice versa.

At 910, a phase of the switching power amplifier output voltage is adjusted based on a phase feedback signal, similarly to the amplitude of the switching power amplifier output voltage.

At 915, a power efficiency of the output voltage is controlled. A pre-driver supply control for efficient amplitude control of the power amplifier output voltage $V_{PA}$ and a dual power supply $V_{DD\_HIGH}$ and $V_{DD\_LOW}$ are used to improve the power efficiency.

Other variations and modifications of the above-described embodiments and methods are possible in light of the teaching discussed herein.

It is also within the scope of the disclosure to implement a program or code that can be stored in a machine-readable or computer-readable medium to permit a computer to perform any of the techniques described above, or a program or code that can be stored in an article of manufacture that includes a computer readable medium on which computer-readable instructions for carrying out embodiments of the inventive techniques are stored. Other variations and modifications of the above-described embodiments and methods are possible in light of the teaching discussed herein.

The above description of illustrated embodiments of the disclosure, including what is described in the Abstract, is not intended to be exhaustive or to limit the invention to the precise forms disclosed. While specific embodiments of, and examples for, the embodiments are described herein for illustrative purposes, various equivalent modifications are possible within the scope of the disclosure, as those skilled in the relevant art will recognize.

These modifications can be made to the embodiments in light of the above detailed description. The terms used in the following claims should not be construed to limit the invention to the specific embodiments disclosed in the specification and the claims. Rather, the scope of the disclosure is to be determined entirely by the following claims, which are to be construed in accordance with established doctrines of claim interpretation.

What is claimed is:

1. A method comprising:
    adjusting an amplitude of a power amplifier output voltage based on an amplitude feedback signal;
    adjusting a phase of the power amplifier output voltage based on a phase feedback signal; and
    controlling a power efficiency of the power amplifier output voltage,
    wherein said controlling the power efficiency comprises:
        comparing an amplitude of an envelope of a modulated signal with a threshold voltage that has a constant level at a first time and switching a bias voltage of the power amplifier from a higher voltage to a lower voltage when the envelope of the modulated signal has the amplitude below the threshold voltage;
        determining to switch the bias voltage of the power amplifier based on the comparison result;
        switching the bias voltage of the power amplifier from the lower voltage to the higher voltage in response to the envelope of the modulated signal having the amplitude above the threshold voltage;
        detecting a local minimum amplitude of an output power of the power amplifier; and
        switching the bias voltage of the power amplifier at a second time when the local minimum amplitude of the output power of the power amplifier is detected, the second time being subsequent to the first time.

2. The method of claim 1, further comprising:
comparing the envelope of the modulated signal with the amplitude feedback signal before adjusting the amplitude of the power amplifier output voltage; and
comparing a phase of the modulated signal with the phase feedback signal before adjusting the phase of the power amplifier output voltage, and
wherein the phase of the power amplifier output voltage is adjusted using a variable delay circuit.

3. The method of claim 1, wherein said controlling the power efficiency further comprises:
switching the bias voltage of the power amplifier from the lower voltage to the higher voltage at the local minimum amplitude of the envelope of the modulated signal.

4. The method of claim 1, wherein said controlling the power efficiency comprises:
switching the bias voltage of the power amplifier from the higher voltage to the lower voltage at the local minimum amplitude of the envelope of the modulated signal.

5. A method comprising:
adjusting an amplitude of a power amplifier output voltage based on an amplitude feedback signal;
adjusting a phase of the power amplifier output voltage based on a phase feedback signal; and
controlling a power efficiency of the power amplifier output voltage,
wherein said controlling the power efficiency comprises:
switching a bias voltage of the power amplifier from a higher voltage to a lower voltage in response to an envelope of a modulated signal having an amplitude below a threshold voltage; and
controlling a driver supply voltage in order to control the amplitude of the power amplifier output voltage, and
wherein said controlling the driver supply voltage comprises:
adjusting a level of the driver supply voltage in response to the amplitude feedback signal;
providing the adjusted driver supply voltage to a driver; and
providing an output voltage of the driver to a power amplifier.

6. The method of claim 1, wherein the amplitude of the power amplifier output voltage is set by a switching frequency.

7. A transmitter comprising:
a first circuit configured to adjust an amplitude of a power amplifier output voltage based on an amplitude feedback signal;
a second circuit configured to adjust a phase of the power amplifier output voltage based on a phase feedback signal; and
a third circuit configured to control a power efficiency of the power amplifier output voltage,
wherein the third circuit includes a switch control circuit configured to compare an amplitude of an envelope of a modulated signal with a threshold voltage that has a constant level and switch a bias voltage of a power amplifier from a higher voltage to a lower voltage when the envelope of the modulated signal has the amplitude below the threshold voltage,
wherein the switch control circuit is configured to switch the bias voltage of the power amplifier from the lower voltage to the higher voltage, in response to the envelope of the modulated signal having the amplitude above the threshold voltage, and
wherein the switch control circuit is configured to compare the amplitude of the envelope of the modulated signal with the threshold voltage at a first time, determine to switch the bias voltage of the power amplifier based on the comparison result, detect a local minimum amplitude of an output power of the power amplifier, and switch the bias voltage of the power amplifier at a second time when the local minimum amplitude of the output power of the power amplifier is detected, the second time being subsequent to the first time.

8. The transmitter of claim 7, wherein the first circuit comprises a comparator configured to compare the amplitude of the envelope of the modulated signal with the amplitude feedback signal, and
wherein the second circuit comprises a peak detector configured to compare a phase of the modulated signal with the phase feedback signal and a variable delay circuit.

9. The transmitter of claim 7, wherein the switch control circuit is configured to switch the bias voltage of the power amplifier from the lower voltage to the higher voltage at the local minimum amplitude of the envelope of the modulated signal.

10. The transmitter of claim 7, wherein the switch control circuit is configured to switch from the higher voltage to the lower voltage at the local minimum amplitude of the envelope of the modulated signal.

11. The transmitter of claim 7, wherein the third circuit further comprises a pre-driver supply control circuit, and
wherein the pre-driver supply control circuit is configured to control a driver supply voltage.

12. The transmitter of claim 11, wherein the third circuit further comprises a driver circuit, and
wherein the pre-driver supply control circuit adjusts a level of the driver supply voltage in response to the amplitude feedback signal and provides the adjusted driver supply voltage to the driver circuit, and
wherein the driver circuit provides an output voltage to the power amplifier.

13. The transmitter of claim 7, wherein the amplitude of the power amplifier output voltage is set by a switching frequency.

14. The method of claim 1, wherein the threshold voltage corresponds to the lower voltage.

15. The transmitter of claim 7, wherein the threshold voltage corresponds to the lower voltage.

* * * * *